(12) United States Patent
Kim

(10) Patent No.: US 10,053,766 B2
(45) Date of Patent: Aug. 21, 2018

(54) MASK FRAME ASSEMBLY AND METHOD OF MANUFACTURING THE SAME

(71) Applicant: Samsung Display Co., Ltd., Yongin, Gyeonggi-Do (KR)

(72) Inventor: Yonghwan Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 350 days.

(21) Appl. No.: 14/807,819

(22) Filed: Jul. 23, 2015

(65) Prior Publication Data
US 2016/0122860 A1    May 5, 2016

(30) Foreign Application Priority Data

Nov. 5, 2014    (KR) .................. 10-2014-0152860

(51) Int. Cl.
*C23C 16/04*    (2006.01)
*C23C 14/04*    (2006.01)
*H01L 51/56*    (2006.01)
*H01L 51/00*    (2006.01)

(52) U.S. Cl.
CPC ........ *C23C 14/042* (2013.01); *H01L 51/0011* (2013.01); *H01L 51/56* (2013.01)

(58) Field of Classification Search
None
See application file for complete search history.

(56) References Cited

U.S. PATENT DOCUMENTS

2003/0108805 A1*  6/2003  Clark ................ C23C 14/042
                                                             430/22
2017/0222145 A1*  8/2017  Kim .................. H01L 45/085

FOREIGN PATENT DOCUMENTS

| JP | 2005-222729 A | 8/2005 |
| JP | 2008-127593 A | 6/2008 |
| KR | 10-2006-0055619 A | 5/2006 |
| KR | 10-2007-0090018 A | 9/2007 |
| KR | 10-2008-0038650 A | 5/2008 |

OTHER PUBLICATIONS

Sung et (KR20090105614) with English Translation.*

* cited by examiner

*Primary Examiner* — Charles Capozzi
(74) *Attorney, Agent, or Firm* — Knobbe, Martens, Olson & Bear, LLP

(57) ABSTRACT

A mask frame assembly and a method of manufacturing the same are disclosed. In one aspect, the mask frame assembly for an organic light-emitting diode display includes a frame including a supporting unit, wherein an opening is formed in the frame. The assembly also includes a unit mask including a deposition pattern portion, wherein the unit mask extends in a first direction, and is fixed to the supporting unit. The assembly further includes a first supporter configured to support the unit mask, wherein a magnet is placed on at least one portion of the first supporter.

7 Claims, 6 Drawing Sheets

MASK FRAME ASSEMBLY AND METHOD OF MANUFACTURING THE SAME

INCORPORATION BY REFERENCE TO ANY PRIORITY APPLICATIONS

This application claims the benefit of Korean Patent Application No. 10-2014-0152860, filed on Nov. 5, 2014, in the Korean Intellectual Property Office, the disclosure of which is incorporated herein in its entirety by reference.

BACKGROUND

Field

The described technology generally relates to a mask frame assembly and a method of manufacturing the same.

Description of the Related Technology

An organic light-emitting diode (OLED) display is an active matrix flat panel display. These displays are driven with a low voltage and are lightweight and thin. They also have wide viewing angles, good contrast, and fast response times, thereby being considered one of the best next-generation display technologies.

SUMMARY OF CERTAIN INVENTIVE ASPECTS

One inventive aspect is a mask frame assembly and a method of manufacturing the same.

Another aspect is a mask frame assembly for an organic light-emitting diode display, comprising a frame including a supporting unit, wherein an opening is formed in the frame. The assembly also comprises a unit mask including a deposition pattern portion, wherein the unit mask extends in a first direction, and is fixed to the supporting unit. The assembly further comprises a first supporter configured to support the unit mask, wherein a magnet is placed on at least one portion of the first supporter.

In the above mask frame assembly, the unit mask includes edges found at opposing ends thereof, wherein the first supporter contacts the edge of the unit mask.

In the above mask frame assembly, the magnet includes first and second portions, wherein the unit mask includes first and second unit masks adjacent to each other, and the first and second portions of the magnet respectively contact the first and second unit masks.

In the above mask frame assembly, the first supporter and the unit mask are formed substantially parallel with each other the first direction.

In the above mask frame assembly, the magnet is configured to pull the unit mask toward the first supporter in a second direction crossing the first direction.

In the above mask frame assembly, the magnet is placed at a center of the first supporter in the first direction.

In the above mask frame assembly, the magnet comprises a plurality of magnets placed in the direction of the length of the first supporter, wherein the magnets are provided to be substantially symmetrical with regard to a center of the first supporter in the first direction.

In the above mask frame assembly, the sizes of the magnets are reduced progressively when the magnets are farther from the center of the first supporter toward both ends thereof.

In the above mask frame assembly, the first supporter has a groove corresponding to and accommodating the magnet.

In the above mask frame assembly, the magnet protrudes from the first supporter to the unit mask, wherein the unit mask has a groove corresponding to and accommodating the magnet.

Another aspect is a mask frame assembly for an organic light-emitting diode display, comprising a frame including a supporting unit, wherein an opening is formed in the frame. The mask assembly further comprises a unit mask including a deposition pattern portion, wherein the unit mask extends in a first direction, and fixed to the supporting unit. The mask assembly also comprises a first supporter configured to support the unit mask, wherein a magnet is placed in at least one portion of the first supporter, and a second supporter extending in a second direction crossing the first direction and configured to support the unit mask.

In the above mask frame assembly, the magnet is placed in a region where the first supporter crosses the second supporter.

In the above mask frame assembly, the magnet has a cross shape.

Another aspect is a method of manufacturing a mask frame assembly for an organic light-emitting diode display, the method comprising forming a frame including a first supporter in a first direction, wherein a magnet is placed on at least one surface of the first supporter. The method also comprises providing a unit mask that includes a deposition pattern portion and extends in the first direction so as to align the unit mask to the frame and applying an attraction force between the magnet and the unit mask in a second direction crossing the first direction so as to substantially flatten the unit mask.

The above method further comprises welding end portions of the unit mask to the frame so as to fix the unit mask to the frame.

In the above method, the flattening comprises placing the magnet at the center of the direction of the length of the first supporter, wherein the magnet contacts an edge of the unit mask.

The above method further comprises forming a groove corresponding to and accommodating the magnet in the unit mask, wherein the magnet protrudes from the first supporter to the unit mask.

The above method further comprises forming a second supporter extending in the second direction so as to cross the first supporter.

In the above method, the magnet is placed in a region where the first supporter crosses the second supporter.

In the above method, the magnet has a cross shape.

DETAILED DESCRIPTION OF CERTAIN INVENTIVE EMBODIMENTS

Figure 1:
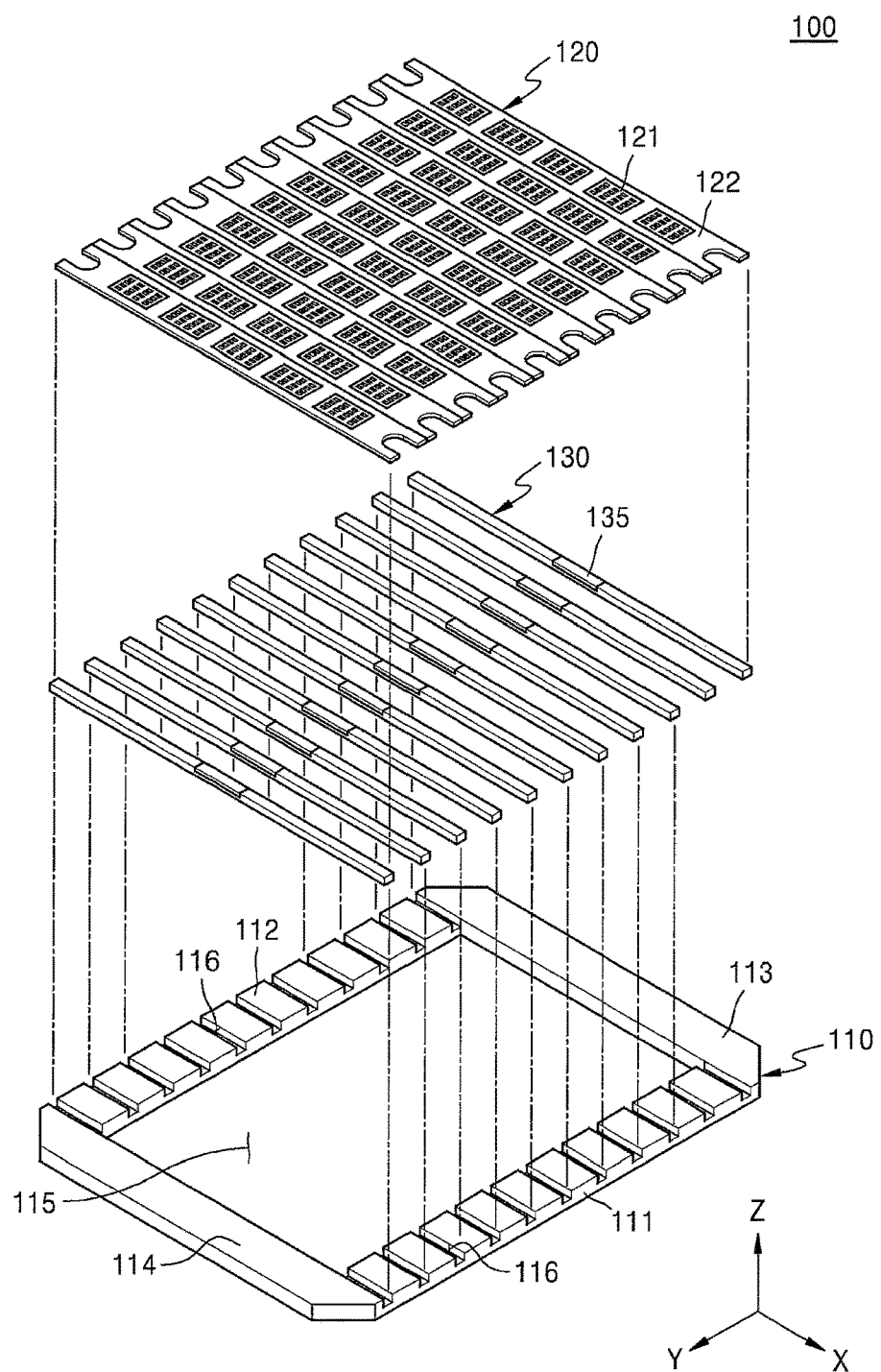
FIG. 1 is an exploded perspective view illustrating a mask frame assembly according to an exemplary embodiment.

In OLED displays, an organic layer and an electrode can be formed by a vacuum deposition process using masks with open slits. However, as the resolution increases, the width of the open slit becomes narrower. Moreover, in order to manufacture a high-resolution OLED display, the shadow effect must be decreased or removed entirely. Therefore, the deposition process is performed when a substrate is closely adhered to a mask. However, technology that enhances the adhesiveness of the substrate and the mask needs to be developed.

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description.

Since the inventive concept can have diverse modified embodiments, preferred embodiments are illustrated in the drawings and are described in the detailed description of the inventive concept. The advantages, features and aspects of the inventive concept will become apparent from the following description of the embodiments with reference to the accompanying drawings, which is set forth hereinafter. The inventive concept can, however, be embodied in different forms and should not be construed as limited to the embodiments set forth herein.

It will be understood that although the terms "first", "second", etc. can be used herein to describe various components, these components should not be limited by these terms. These components are only used to distinguish one component from another. As used herein, the singular forms "a," "an", and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Sizes of elements in the drawings can be exaggerated for convenience of explanation. In other words, since sizes and thicknesses of components in the drawings are arbitrarily illustrated for convenience of explanation, the following embodiments are not limited thereto. When a certain embodiment can be implemented differently, a specific process order can be performed differently from the described order. For example, two consecutively described processes can be performed substantially at the same time or performed in an order opposite to the described order.

In the following examples, the x-axis, the y-axis, and the z-axis are not limited to the three axes of the rectangular coordinate system, and can be interpreted in a broader sense. For example, the x-axis, the y-axis, and the z-axis can be perpendicular to one another, or can represent different directions that are not perpendicular to one another.

Hereinafter, embodiments of the inventive concept will be described in detail with reference to the accompanying drawings. In addition, in the present specification and drawings, like reference numerals refer to like elements throughout, and thus, a redundant description is omitted. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
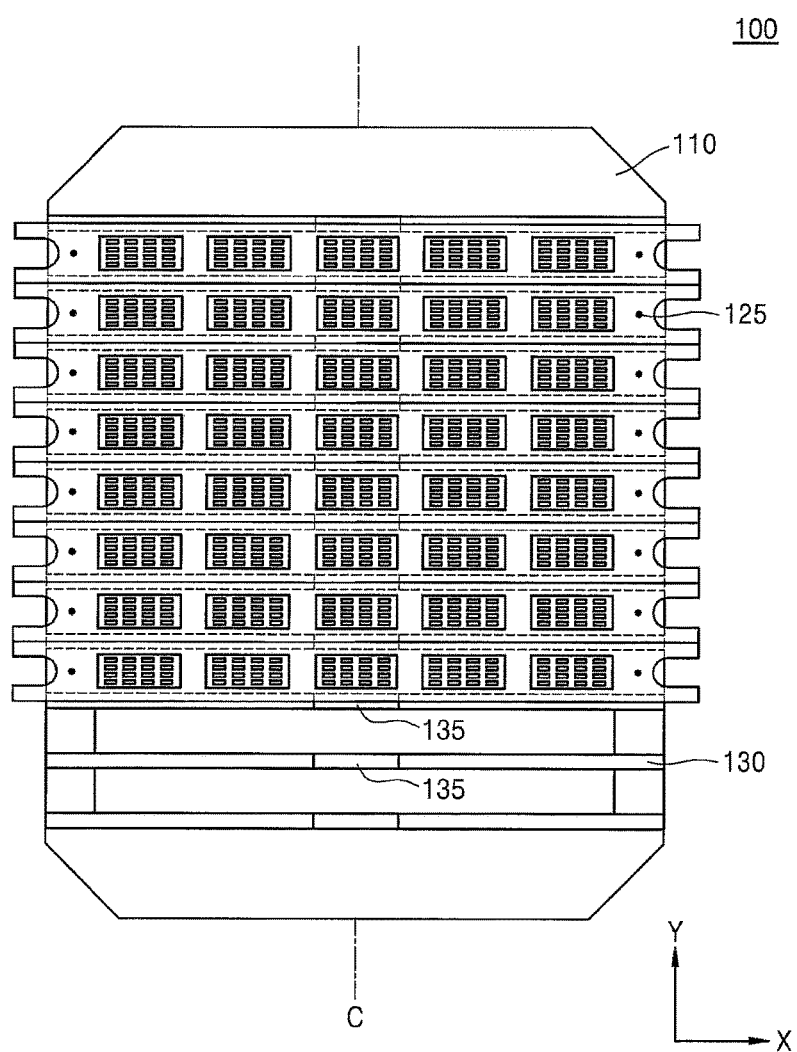
FIG. 2 is a plan view illustrating a mask frame assembly according to an exemplary embodiment.

FIG. 1 is an exploded perspective view illustrating a mask frame assembly 100 according to an exemplary embodiment. FIG. 2 is a plan view illustrating the mask frame assembly 100 according to an exemplary embodiment.

Referring to FIGS. 1 and 2, the mask frame assembly 100 includes a frame 110, a unit mask 120, and a first supporter 130.

The frame 110 can be coupled to the unit mask 120 and can support the unit mask 120. The frame 110 can include an opening 115, through which deposition material passes, and a supporting unit which is provided outside the opening 115. The frame 110 can be formed of metal or a synthetic resin, have a tetragonal shape, and include one or more of the openings 115. However, the present embodiment is not limited thereto, and the frame 110 can be substantially circular and substantially hexagonal.

A plurality of the supporting units include a first supporting unit 111 and a second supporting unit 112, which face each other along an X direction and are formed substantially parallel to each other along a Y direction. The supporting units also include a third supporting unit 113 and a fourth supporting unit 114 which face each other along the Y direction and are formed substantially parallel to each other along the X direction. The first to fourth supporting units 111 to 114 form a substantially tetragonal frame in which the first to fourth supporting units 111 to 114 are connected to one another.

The supporting units can include a first inserting groove 116 into which the first supporter 130 is inserted. The first inserting groove 116 can be provided at the supporting unit, and the first inserting groove 116 can be formed at the frame 110. The depth of the first inserting groove 116 can be substantially equal to a thickness of the first supporter 130. Hereinafter, for convenience of description, a case in which the first inserting groove 116 is formed in each of the first and second supporting units 111 and 112 will be described in detail, but embodiments are not limited thereto.

The unit mask 120 can be provided as one large member and can be coupled to the frame 110. Also, the unit mask 120 can include a plurality of division masks having a stick shape so as to disperse its own weight. Hereinafter, for convenience of description, a case in which the unit mask 120 includes division masks having a stick shape will be described in detail, but embodiments are not limited thereto.

The unit mask 120 can include a deposition pattern portion 121, through which the deposition material passes and which forms a deposition region on a substrate. The unit mask 120 can also include a rib portion 122 connected to the deposition pattern portion 121. Also, both ends of the unit mask 120 can protrude outwardly in the X direction so as to easily clamp the unit mask 120 when the unit mask 120 is fixed to the frame 110.

The deposition pattern portion 121 can be formed in correspondence with the opening 115 of the frame 110. The deposition material passing through the opening 115 and a pattern for deposition can define the deposition region on the substrate. The deposition pattern portion 121 is illustrated as including a plurality of masking patterns having a substantially dot shape. However, the present embodiment is not limited thereto, and it is obvious to one of ordinary skill in the art that various modification examples can be realized. That is, the deposition pattern portion 121 can include a masking pattern, which maintains a state where a front surface is opened, or a masking pattern having a slit shape. The number, arrangement position, and shape of the deposition pattern portion 121 illustrated in FIG. 1 are an example, and the present embodiment is not limited thereto.

The rib portion 122 can be connected to the deposition pattern portion 121 and can support the deposition pattern portion 121. The rib portion 122 can be formed between one deposition pattern portion and another deposition pattern portion adjacent thereto.

A plurality of the unit masks 120 can be formed adjacent to each other, and can be formed to surround the opening 115 of the frame 110. The unit mask 120 extends in an X-axis direction (hereinafter, referred to as a first direction) and is formed at the frame 10. The unit mask 120 extends in the first direction along the first supporter 130 and is fixed to the supporting unit. In detail, the both ends of the unit mask 120 are clamped and extend in the first direction. The extended unit mask 120 is aligned along the first supporter 130 at the frame 110. A side of the unit mask 120 is aligned to be supported by the first supporter 130.

The first supporter 130 can be formed to support the unit mask 120. The first supporter 130 and the unit mask 120 can be formed to be substantially parallel with the first direction. The first supporter 130 can support an edge of the unit mask 120. The first supporter 130 can be formed in a length direction of the unit mask 120 between one unit mask 120 and another unit mask 120 adjacent thereto, and can support the side of the unit mask 120. The first supporter 130 can be formed in the first inserting groove 116 and fixed to the frame 110.

A portion of a magnet unit 135 can contact a first unit mask of the plurality of unit masks 120, and the other portion of the magnet unit 135 can contact a second unit mask adjacent to the first unit mask. One first supporter 130 contacts two adjacent unit masks 120, and thus, one magnet unit 135 can contact two adjacent unit masks 120.

The magnet unit 135 can apply an attraction force to the first supporter 130 and the unit mask 120, which extends in a second direction substantially perpendicular to or crossing the first direction. The unit mask 120 extends in the first direction and is formed on the frame 110. When the unit mask 120 extends in the first direction, the unit mask 120 is creased, or a center C of the unit mask 120 can be contracted in the second direction, thereby modifying the deposition pattern portion 121. The magnet unit 135 can apply the attraction force to the contracted unit mask 120 in the second direction along with the first supporter 130, and thus, the creases of the unit mask 120 are removed, whereby the unit mask 120 is substantially flat.

Figure 3A:
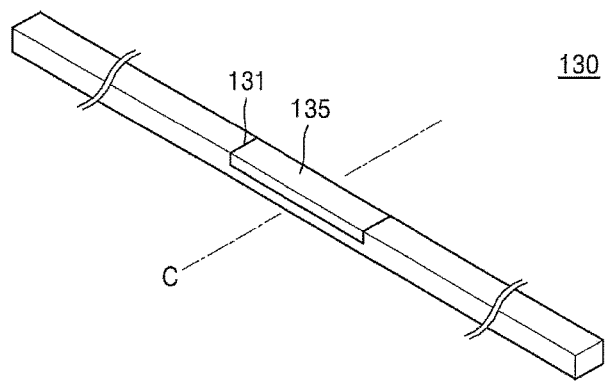
FIGS. 3A to 3C are perspective views illustrating an exemplary embodiment and a modification example of the first supporter of FIG. 1.
Figure 3B:
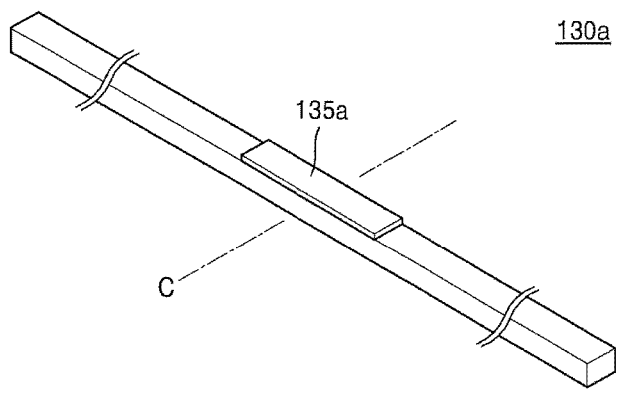
Figure 3C:
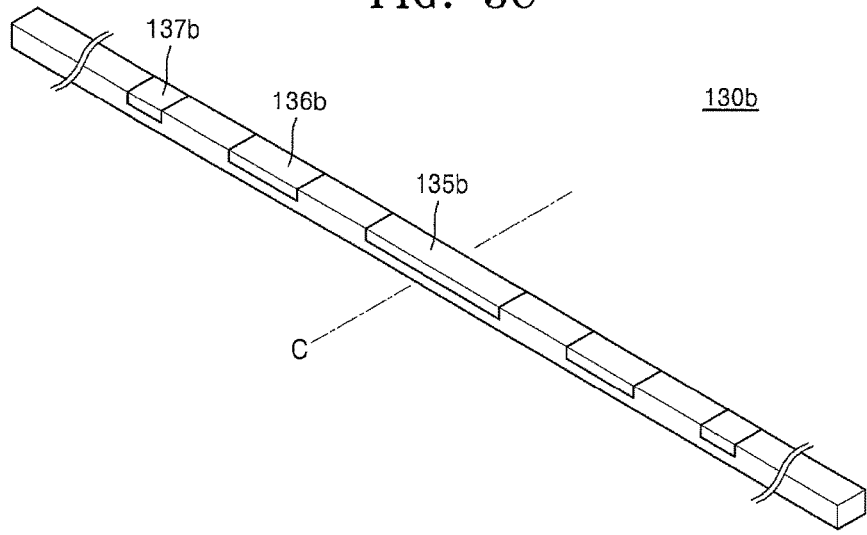

FIGS. 3A to 3C are perspective views illustrating an exemplary embodiment and a modification example of the first supporter 130 of FIG. 1.

Referring to FIGS. 3A to 3C, exemplary embodiments of the first supporter 130 are shown. The magnet unit 135 can be provided in at least one portion of the first supporter 130. The magnet unit 135 can be formed at a center C in the length-direction of the first supporter 130.

Referring to FIG. 3A, the magnet unit 135 can be inserted into the first supporter 130. The first supporter 130 can include a groove 131 corresponding to the magnet unit 135. The magnet unit 135 can be inserted into the groove 131 and can be fixed to the first supporter 130. A surface of the first supporter 130 can be substantially flat and can prevent the unit mask 120 from being partially detached from the first supporter 130.

Referring to FIG. 3B, a magnet unit 135a can be provided to protrude from the first supporter 130a. The magnet unit 135a can protrude from the first supporter 130a to the unit mask 120. A groove (not shown) corresponding to the magnet unit 135a can be formed in the unit mask 120, and the magnet unit 135a can be inserted into the groove. The magnet unit 135a can be coupled to the groove of the unit mask 120, and thus, a contact area of the magnet unit 135a and the unit mask 120 increases, thereby enhancing a coupling force.

A first magnet unit 135b can be provided in plurality in a length direction of a first supporter 130b. The number of magnets is not limited to a certain number, but for convenience of description, the following description will focus on a case in which five magnets are provided. The first magnet unit 135b can be provided to be symmetrical about the center C of the first supporter 130b. A size of the first magnet unit 135b can be reduced progressively away from the length-direction center C of the first supporter 130b to both ends.

Referring to FIG. 3C, a second magnet unit 136b and a third magnet unit 137b that are respectively formed at the both ends can be symmetrical with respect to a center C of the first magnet unit 135b. The size of the first magnet unit 135b can be greater than that of the second magnet unit 136b or the third magnet unit 137b. When the unit mask 120 extends, the center C of the unit mask 120 contracts the greatest. The largest magnet can be provided at the center C of the unit mask 120, and thus, the largest attraction force can be generated at the length-direction center C of the unit mask 120.

Figure 4A:
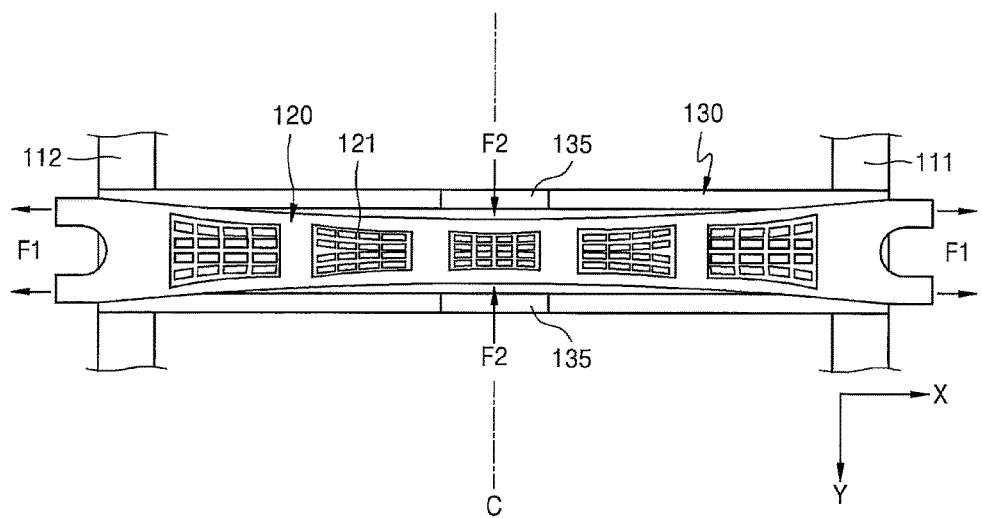
FIGS. 4A and 4B are plan views illustrating a method of manufacturing a mask frame assembly, according to an exemplary embodiment.
Figure 4B:
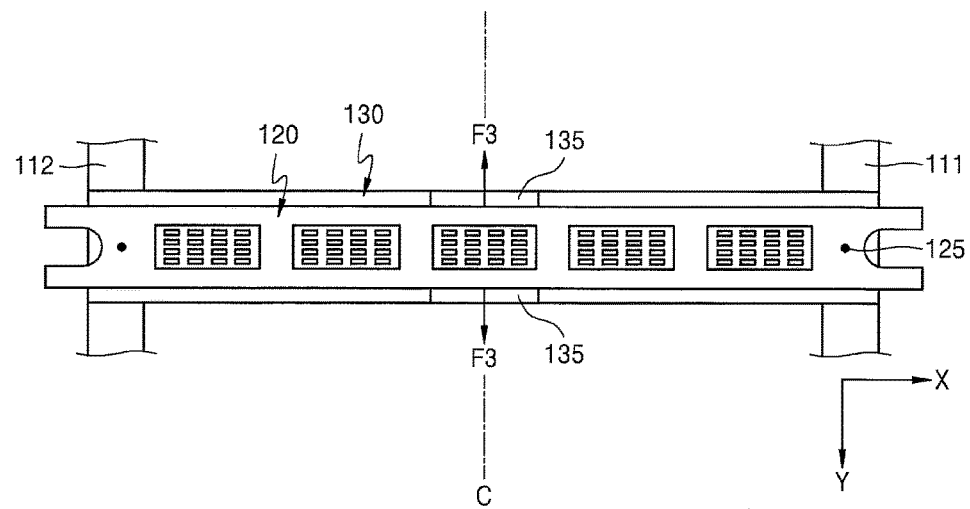

FIGS. 4A and 4B are plan views illustrating a method of manufacturing the mask frame assembly 100, according to an exemplary embodiment.

Referring to FIGS. 4A and 4B, the method of manufacturing the mask frame assembly 100 includes forming the first supporter 130, extending and aligning the unit mask 120, substantially flatly forming the unit mask 120, and fixing the unit mask 120 to the frame 110.

In the forming of the first supporter 130, the first supporter 130 can be fixed to the frame 110. The first supporter 130 can be formed in the first inserting groove 116 of the frame 110.

Referring to FIG. 4A, in the extending and aligning of the unit mask 120, the unit mask 120 extends in the first direction. Both ends of the unit mask 120 extend in F1 directions to be fixed to the frame 110 without a surface of the unit mask 120 being creased. When both ends of the unit mask 120 are clamped and extend (F1), the unit mask 120 is modified. A central portion of the unit mask 120 is greatly modified and is contracted (F2) in the second direction. Due to the modification of the unit mask 120, the surface of the unit mask 120 is creased, the deposition pattern portion 121 is modified. Thus, the pattern is not uniform, or the unit mask 120 is changed in size, and therefore, it is difficult to align the deposition pattern portion 121.

Referring to FIG. 4B, in the substantially flatly forming of the unit mask 120, the magnet unit 135 generates an attraction force F3 between the unit mask 120 and the first supporter 130. The magnet unit 135 can be formed at the central portion of the unit mask 120 and can generate the attraction force F3 in a direction opposite to a contraction direction of the unit mask 120. The surface of the unit mask 120 can be substantially flatly formed by an attraction force between the magnet unit 135 and the unit mask 120, and the modification of the deposition pattern portion 121 is minimized or reduced.

In the fixing of the unit mask 120 to the frame 110, a welding unit 125 can be provided at the both ends of the unit mask 120, and the unit mask 120 can be fixed to the frame 110.

In the mask frame assembly 100 and the method of manufacturing the same, the magnet unit 135 can be provided at the first supporter 130 that supports the unit mask 120, and modification caused by an extension of the unit mask 120 is minimized or reduced.

Moreover, in the mask frame assembly 100 and the method of manufacturing the same, by reducing or minimizing the modification caused by the extension of the unit mask 120, a deposition pattern that passes through the mask frame assembly 100 and is formed on a substrate is precisely formed.

Figure 5:
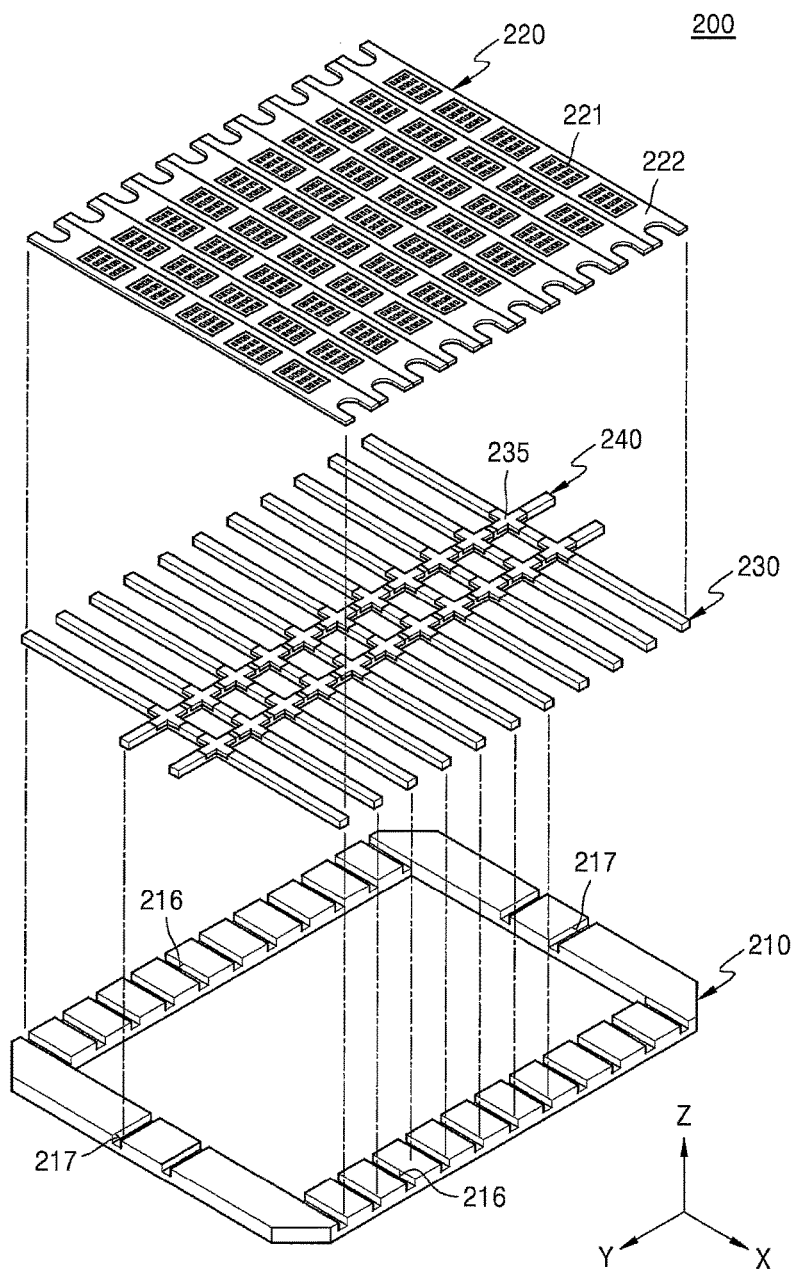
FIG. 5 is a perspective view illustrating a mask frame assembly according to another exemplary embodiment.
Figure 6:
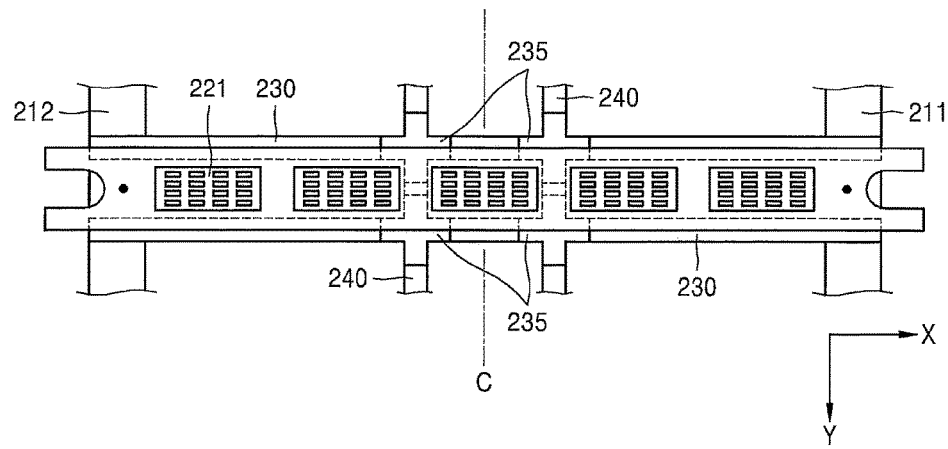
FIG. 6 is a plan view illustrating a portion of the mask frame assembly of FIG. 5.

FIG. 5 is a perspective view illustrating a mask frame assembly 200 according to another exemplary embodiment. FIG. 6 is a plan view illustrating a portion of the mask frame assembly 200 of FIG. 5.

Referring to FIGS. 5 and 6, the mask frame assembly 200 includes a frame 210, a unit mask 220, a first supporter 230, and a second supporter 240. The frame 210 and the unit mask 220 are the same as or similar to the frame 110 and unit mask 120 of the mask frame assembly 100 according to an exemplary embodiment, and thus, their detailed descriptions are not provided or will be briefly described.

The first supporter 230 can be provided to be inserted into a first inserting groove 216 of the frame 210. The first supporter 230 can be formed in a first direction and can support a side of the unit mask 220.

The second supporter 240 can be provided to be inserted into a second inserting groove 217 of the frame 210. The second supporter 240 can support a rib portion 222, which is provided between adjacent deposition pattern portions 221. The second supporter 240 can be formed in a second direction and can support a plurality of the unit masks 220. The number of second supporters 240 is not limited to a certain number. Hereinafter, for convenience of description, a case in which two second supporters 240 are provided will be described in detail.

A magnet unit 235 can be formed in a region where the first supporter 230 intersects the second supporter 240. The magnet unit 235 can be provided in a cross (+) shape. A contact area of the unit mask 220 is enlarged in the region where the first supporter 230 intersects the second supporter 240, thereby preventing the unit mask 220 from being sagged. Also, the magnet unit 235 can apply an attraction force to the unit mask 220, thereby preventing the unit mask 220 from being creased.

The magnet unit 235 can be provided to be symmetrical about the center C of the mask frame assembly 200 in a Y-axis direction. The magnet unit 235 can be formed adjacent to the center C of the unit mask 220. The magnet unit 235 can generate the attraction force in the first direction and the second direction, thereby preventing the extended unit mask 220 from being creased.

A method of manufacturing the mask frame assembly 200 can include forming the first supporter 230, extending and aligning the unit mask 220, substantially flatly forming the unit mask 220, and fixing the unit mask 220 to the frame 210. The forming of the first supporter 230, the extending and aligning of the unit mask 220, and the fixing of the unit mask 220 to the frame 210 are the same as or similar to the method of manufacturing the mask frame assembly 100, according to an exemplary embodiment, and thus, their detailed descriptions are not provided or will be briefly described.

In the substantially flatly forming of the unit mask 220, the magnet unit 235 can generate an attraction force between the unit mask 220 and the first and second supporters 230 and 240. When the unit mask 220 extends, a central portion of the unit mask 220 is the largest modified portion. A plurality of the magnet units 235 can be formed at the center of the unit mask 220, and the magnet unit 235 and the unit mask 220 can generate the attraction in the first direction and the second direction. That is, by attracting the central portion of the unit mask 220, which is modified largely, the unit mask 220 is prevented from being creased, and a deposition pattern portion 221 is prevented from being modified.

In the mask frame assembly 200 and the method of manufacturing the same, the magnet unit 235 is provided at the first and second supporters 230 and 240, which support the unit mask 230, thereby minimizing or reducing modification caused by an extension of the unit mask 220.

Moreover, in the mask frame assembly 200 and the method of manufacturing the same, by minimizing or reducing the modification caused by the extension of the unit mask 220, a deposition pattern that passes through the mask frame assembly 200 and is formed on a substrate is precisely formed.

Figure 7:
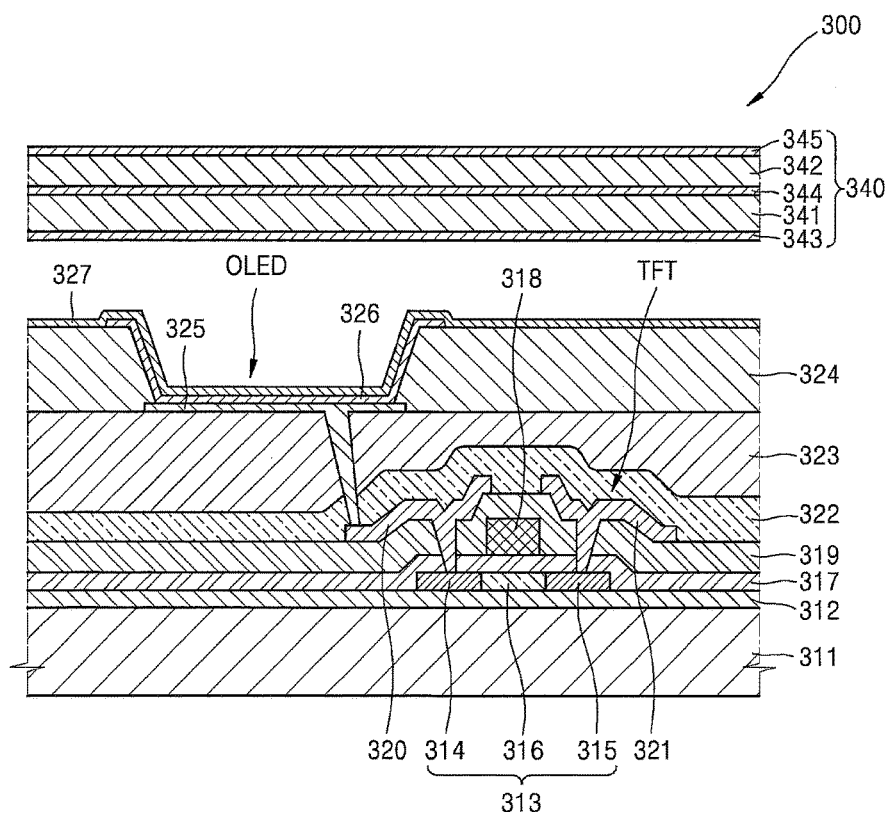
FIG. 7 is a diagram illustrating an OLED display which is manufactured by using the mask frame assembly for deposition illustrated in FIG. 1.

FIG. 7 is a diagram illustrating an OLED display 300 which is manufactured by using the mask frame assembly 100 for deposition illustrated in FIG. 1.

Referring to FIG. 7, a substrate 311 is provided in the OLED display 300. The substrate 311 includes an insulating material having flexibility. For example, the substrate 311 is a glass substrate. Also, the substrate 311 can be formed of a polymer material such as polyimide (PI), polycarbonate (PC), polyethersulphone (PES), polyethylene terephthalate (PET), polyethylene naphthalate (PEN), polyarylate (PAR), or fiber glass reinforced plastic (FRP). The substrate 311 can be transparent, semitransparent, or opaque.

A barrier layer 312 can be formed on the substrate 311. The barrier layer 312 can be formed to completely cover an upper surface of the substrate 311. The barrier layer 312 can include an inorganic layer or an organic layer. The barrier layer 312 can be formed as a single layer, or can be stacked as multiple layers. For example, the barrier layer 312 is formed of inorganic materials, such as silicon oxide (SiOx), silicon nitride (SiNx), silicon oxynitride (SiON), aluminum oxide (AlO), aluminum oxynitride (AlON), and organic materials such as acryl, polyimide, and polyester.

The barrier layer 312 prevents penetration of oxygen and moisture, prevents moisture or impurities from being diffused through the substrate 311, and provides a flat surface to a top of the substrate 311. A thin film transistor (TFT) can be formed on the barrier layer 312. The TFT according to an exemplary embodiment is exemplified as a top gate-type TFT, or can include another TFT having a bottom gate-type structure.

A semiconductor active layer 313 can be formed on the barrier layer 312. The semiconductor active layer 313 can include a source region 314 and a drain region 315, which are formed by doping N-type impurity ions or P-type impurity ions. A region between the source region 314 and the drain region 315 is a channel region 316, on which impurities are not doped.

When the semiconductor active layer 313 is formed of polysilicon, amorphous silicon can be provided, and can be changed to polysilicon by crystallizing the amorphous silicon. Also, the semiconductor active layer 313 can be formed of an oxide semiconductor. For example, the oxide semiconductor includes an oxide of a material selected from Group 4, 12, 13, and 14 metal elements, such as zinc (Zn), indium (In), gallium (Ga), tin (Sn), cadmium (Cd), germanium (Ge), and hafnium (Hf), and a combination thereof.

A gate insulating layer 317 can be deposited on the semiconductor active layer 313. The gate insulating layer 317 can include an inorganic layer formed of, for example, silicon oxide, silicon nitride, or metal oxide. The gate insulating layer 317 can have a structure of a single layer or a multi-layer structure.

A gate electrode 318 can be formed in a certain region on the gate insulating layer 317. The gate electrode 318 can include a single layer or a multi-layer structure formed of, for example, gold (Au), silver (Ag), copper (Cu), nickel (Ni), platinum (Pt), palladium (Pd), aluminum (Al), molybdenum (Mo), or chromium (Cr), or include an alloy such as Al:Nd or Mo:W.

An interlayer insulating layer 319 can be formed on the gate electrode 318. The interlayer insulating layer 319 can be formed of an insulating material such as silicon oxide or silicon nitride. Also, the interlayer insulating layer 319 can be formed as an insulating organic layer.

A source electrode 320 and a drain electrode 321 can be formed on the interlayer insulating layer 319. In detail, a contact hole can be formed in each of the gate insulating layer 317 and the interlayer insulating layer 319 by removing a portion of the gate insulating layer 317 and a portion of the interlayer insulating layer 319. The source electrode 320 is electrically connected to the source region 314 through the contact hole, and the drain electrode 321 is electrically connected to the drain region 315 through the contact hole.

A passivation layer 322 can be formed on the source electrode 320 and the drain electrode 321. The passivation layer 322 can be formed as an inorganic layer, such as silicon oxide or silicon nitride, or an organic layer.

A planarizing layer 323 can be formed on the passivation layer 322. The planarizing layer 323 can include an organic layer such as acryl, polyimide, or benzocyclobutene (BCB).

An OLED can be formed on the TFT. The OLED can include a first electrode 325, a second electrode 327, and an intermediate layer 326 between the first electrode 325 and the second electrode 327.

The first electrode 325 can be electrically connected to the source electrode 320 or the drain electrode 321 through the contact hole. The first electrode 325 can correspond to a pixel electrode.

The first electrode 325 acts as an anode and can be formed of various conductive materials. The first electrode 325 can be formed as a transparent electrode or a reflective electrode.

For example, when the first electrode 325 is used as a transparent electrode, the first electrode 325 includes indium tin oxide (ITO), indium zinc oxide (IZO), zinc oxide (ZnO), or indium oxide ($In_2O_3$). When the first electrode 325 is used as a reflective electrode, a reflective layer can be formed of silver (Ag), magnesium (Mg), aluminum (Al), platinum (Pt), palladium (Pd), gold (Au), nickel (Ni), neodymium (Nd), iridium (Ir), chromium (Cr), or a combination thereof, and then, ITO, IZO, ZnO, or $In_2O_3$ can be formed on the reflective layer.

A pixel-defining layer 324 can be formed on the planarizing layer 323 and cover an edge of the first electrode 325 of the organic light-emitting device OLED. The pixel-defining layer 324 defines an emission region of each sub-pixel by surrounding the edge of the first electrode 325.

The pixel-defining layer 324 can be formed of an organic material or an inorganic material. For example, the pixel-defining layer 324 is formed of an organic material, such as polyimide, polyamide, BCB, acrylic resin, or phenol resin, or an inorganic material such as SiNx. The pixel-defining layer 324 can be formed as a single layer or a multi-layer structure.

The intermediate layer 326 can be formed on the pixel-defining layer 324 and in a region which is exposed by etching a portion of the pixel-defining layer 324. The intermediate layer 326 can be formed by a deposition process.

The intermediate layer 326 can be formed of a low-molecular organic material or a polymer organic material. The intermediate layer 326 can include an organic emissive layer (EML). As another optional example, the intermediate layer 326 includes an organic EML, and further includes at least one selected from the group consisting of a hole injection layer (HIL), a hole transport layer (HTL), an electron transport layer (ETL), and an electron injection layer (EIL). However, the present embodiment is not limited thereto. As another example, the intermediate layer 326 includes an EML, and further includes various functional layers.

The second electrode 327 can be formed on the intermediate layer 326. The second electrode 327 can correspond to a common electrode. Similarly to the first electrode 325, the second electrode 327 can be formed as a transparent electrode or a reflective electrode.

When the first electrode 325 is formed as a transparent electrode or a reflective electrode, the first electrode 325 can be formed in a shape corresponding to an opening of each sub-pixel. On the other hand, in the second electrode 327, a transparent electrode or a reflective electrode can be deposited all over a display unit. Alternatively, the second electrode 327 can be formed in a certain pattern instead of the over deposition. The first electrode 325 and the second electrode 327 can be switched in their formed positions, and can be stacked.

The first electrode 325 can be insulated from the second electrode 327 by the intermediate layer 326. When a voltage is applied to the first electrode 325 and the second electrode 327, visible light can be emitted from the intermediate layer 326, and thus, an image visible to a user can be realized.

An encapsulation unit 340 can be formed on the OLED. The encapsulation unit 340 is formed for protecting the intermediate layer 326 and the other thin layers from external moisture or oxygen.

The encapsulation unit 340 can have a structure in which at least one organic layer or inorganic layer is stacked. For example, the encapsulation unit 340 can have a structure in which at least one or more organic layers 341 and 342, such as epoxy, polyimide, polyethylene terephthalate, polycarbonate, polyethylene, and polyarylate, and at least one or more inorganic layers 343 to 345, such as $SIO_2$, SiNx, $Al_2O_3$, $TiO_2$, ZiOx, and ZnO, are stacked.

The encapsulation unit 340 can have a structure in which at least one selected from the organic layers 341 and 342 is stacked, and at least two selected from the inorganic layers 343 to 345 are stacked. In the encapsulation unit 340, an uppermost layer, namely, the inorganic layer 345, exposed to the outside can prevent moisture from penetrating into the OLED.

As described above, according to the one or more of the above exemplary embodiments, creases formed in a unit mask are minimized, and thus, an adhesiveness of a substrate and the unit mask is enhanced, thereby precisely depositing a deposition material on the substrate.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A mask frame assembly for an organic light-emitting diode display, comprising:
   a frame including a mask supporter, wherein an opening is formed in the frame;
   a unit mask including a deposition pattern portion, wherein the unit mask extends in a first direction, and is fixed to the mask supporter; and
   a first supporter configured to support the unit mask, wherein a magnet is placed on at least one portion of the first supporter,
   wherein the unit mask includes edges found at opposing ends thereof, and wherein the first supporter contacts an edge of the unit mask,
   wherein the magnet includes first and second portions, wherein the unit mask includes first and second unit masks adjacent to each other, and wherein the first and second portions of the magnet respectively contact the first and second unit masks.

2. The mask frame assembly of claim 1, wherein the first supporter and the unit mask are formed substantially parallel with each other in the first direction.

3. The mask frame assembly of claim 2, wherein the magnet is configured to pull the unit mask toward the first supporter in a second direction crossing the first direction.

4. The mask frame assembly of claim 1, wherein the magnet is placed at a center of the first supporter in the first direction.

5. The mask frame assembly of claim 1, wherein the magnet comprises a plurality of magnets placed in the direction of the length of the first supporter, and wherein the magnets are provided to be substantially symmetrical with regard to a center of the first supporter in the first direction.

6. The mask frame assembly of claim 5, wherein the sizes of the magnets are reduced progressively when the magnets are farther from the center of the first supporter toward both ends thereof.

7. The mask frame assembly of claim 1, wherein the first supporter has a groove corresponding to and accommodating the magnet.

* * * * *